US008848416B2

(12) United States Patent  (10) Patent No.: US 8,848,416 B2
Otsuka  (45) Date of Patent: Sep. 30, 2014

(54) SEMICONDUCTOR STORAGE DEVICE WITH WIRING THAT CONSERVES SPACE

(75) Inventor: Masayuki Otsuka, Tokyo (JP)

(73) Assignee: Lapis Semiconductor Co., Ltd., Yokohama (JP)

( * ) Notice: Subject to any disclaimer, the term of this patent is extended or adjusted under 35 U.S.C. 154(b) by 342 days.

(21) Appl. No.: 13/331,451

(22) Filed: Dec. 20, 2011

(65) Prior Publication Data

US 2012/0163105 A1   Jun. 28, 2012

(30) Foreign Application Priority Data

Dec. 22, 2010   (JP) ................................. 2010-286152

(51) Int. Cl.
*G11C 17/00* (2006.01)
*H01L 27/11* (2006.01)
*G11C 29/00* (2006.01)
*G11C 17/14* (2006.01)
*H01L 27/02* (2006.01)
*G11C 5/14* (2006.01)
*H01L 27/118* (2006.01)
*H01L 27/108* (2006.01)
*H01L 23/525* (2006.01)

(52) U.S. Cl.
CPC ........ *H01L 23/5256* (2013.01); *H01L 27/1116* (2013.01); *G11C 29/787* (2013.01); *G11C 17/143* (2013.01); *G11C 2229/766* (2013.01); *H01L 27/0207* (2013.01); *G11C 5/14* (2013.01); *H01L 27/11803* (2013.01); *H01L 27/10897* (2013.01)
USPC ........ 365/96; 365/200; 365/104; 365/189.05; 365/189.07; 365/225.7

(58) Field of Classification Search
CPC .... G11C 17/16; G11C 17/143; G11C 17/165; G11C 29/789; G11C 2229/766; G11C 2229/763
USPC ......... 365/96, 200, 201, 104, 189.05, 189.07, 365/225.7
See application file for complete search history.

(56) References Cited

U.S. PATENT DOCUMENTS

| 6,291,844 B1* | 9/2001 | Aoki .............................. 257/209 |
| 2005/0221539 A1 | 10/2005 | Kim et al. |
| 2012/0163105 A1* | 6/2012 | Otsuka .......................... 365/200 |

FOREIGN PATENT DOCUMENTS

| JP | 9-64310 A | 3/1997 |
| JP | 11-17016 A | 1/1999 |
| JP | 11-17018 A | 1/1999 |
| JP | 11-297955 A | 10/1999 |
| JP | 2005-268403 A | 9/2005 |
| WO | WO 2004-013909 A1 | 2/2004 |

* cited by examiner

*Primary Examiner* — Tha-O H Bui
(74) *Attorney, Agent, or Firm* — Rabin & Berdo, P.C.

(57) ABSTRACT

A semiconductor storage device has a great number of logic circuits and fuse blocks with its space-saving design. In the semiconductor storage device, a plurality of fuse blocks is arranged in a line or row in the vicinity of a gate array. Each fuse block includes a plurality of fuse pieces arranged in a juxtaposed manner and exposed to the exterior through a fuse window. A power-supply wire and a ground wire extend along the juxtaposed direction of the fuse pieces. Spacing in the vicinity of the gate array is used for arrangement of the fuse blocks.

17 Claims, 5 Drawing Sheets

SEMICONDUCTOR STORAGE DEVICE WITH WIRING THAT CONSERVES SPACE

BACKGROUND OF THE INVENTION

1. Field of the Invention

The present invention relates to a semiconductor storage device having fuse blocks each including a plurality of fuse pieces that are cuttable (disconnectable) for selection of alternative memory cells in place of defective memory cells.

2. Description of the Related Art

A semiconductor storage device is known that is provided with fuse blocks for selecting alternative memory cells in place of defective memory cells. For example, such device is disclosed in Japanese Patent No. 3099802. This patent was published on Oct. 29, 1999 in Japan with the publication (Kokai) number 11-297955.

FIG. 1 of the accompanying drawings depicts a conventional semiconductor storage device 1 having a plurality of fuse blocks. This device 1 is similar to the semiconductor storage device of Japanese Patent No. 3099802 in terms of fuse blocks. A gate array 10 is disposed between a memory cell array 5 and a memory cell array 6. A logic circuit 21 and fuse blocks 31 and 32 are arranged in line between the gate array 10 and the right memory cell array 5. Another logic circuit 22 and fuse blocks 33 and 34 are arranged in line between the gate array 10 and the left memory cell array 6. It should be noted that a plurality of fuse blocks (not depicted) are also provided next to the fuse blocks 32 and 34 in an actual arrangement. Each memory cell array 5, 6 has a plurality of memory cells.

Each of the fuse blocks 31 to 34 for example includes a plurality of fuse pieces (not depicted) for storing defective memory addresses of defective memory cells (not depicted) in the memory cell arrays 5 and 6. The blocks can store defective memory addresses corresponding to the defective memory cells based on the cutting mode that are obtained by selectively cutting the fuse pieces with laser beam irradiations.

Each of the logic circuits 21 and 22 is for example a circuit that, when a defective memory address set by each of the fuse blocks 31 to 34 matches a memory address indicated by an external memory access signal, selects one backup memory cell (not shown) corresponding to the defective memory address.

Between the gate array 10 and the logic circuit 21 and fuse blocks 31, 32 and between the gate array 10 and the logic circuit 22 and fuse blocks 33, 34 are arranged dedicated power-supply wires for the gate array 10, i.e., power-supply wires 41 and 42 for VSS supply and power-supply wires 51 and 52 for VDD supply. On top of the logic circuits 21 and 22 and the fuse blocks 31 to 34 are arranged dedicated power-supply wires for the logic circuits and the fuse blocks, i.e., power-supply wires 43 and 44 for VSS supply and power-supply wires 53 and 54 for VDD supply.

Supply wires 60-1 to 60-$n$ ($n$ is an integer greater than or equal to 2) are arranged to supply VSS potentials to transistors (not shown) in the gate array 10, and supply wires 65-1 to 65-$n$ are arranged to supply VDD potentials to the transistors in the gate array 10. One end of each of the supply wires 60-1 to 60-$n$ is connected to the power-supply wire 41, and the other end thereof is connected to the power-supply wire 42. One end of each of the supply wires 65-1 to 65-$n$ is connected to the power-supply wire 51, and the other end thereof is connected to the power-supply wire 52.

SUMMARY OF THE INVENTION

Recent developments and advancements of the memory cell array toward a larger capacity, however, are necessitating an increasing number of logic circuits and fuse blocks. This makes it difficult to arrange the logic circuits and the fuse blocks in a single line on both sides of the gate array 10 as depicted in FIG. 1.

Thus, as shown in FIG. 2 of the accompanying drawings, logic circuits 21 to 26 and fuse blocks 31 to 36 may be arranged in different lines from each other on the outside of the dedicated power-supply wires 41, 42, 51 and 52. This configuration, however, needs an additional region to arrange four power-supply wires 45, 46, 55, and 56 for the supply of VSS and VDD to the logic circuits 21 to 26. This results in an increase in size of the semiconductor storage device 1 as compared with the prior art configuration of FIG. 1.

It is one object of the present invention to provide a semiconductor storage device capable of disposing a greater number of logic circuits and fuse blocks with space-saving design.

According to one aspect of the present invention, there is provided a semiconductor storage device that includes a memory cell array. The memory cell array includes a plurality of memory cells. The semiconductor storage device also includes a plurality of fuse blocks. Each fuse block is connected to power-supply wiring and to ground wiring. Each fuse block includes a plurality of fuse pieces arranged in a juxtaposed manner. The fuse pieces are exposed to the outside through a fuse window. Each fuse block stores a defective memory address determined by a mode of cutting the fuse piece(s). The semiconductor storage device also includes a selection circuit that selects one of the memory cells based on a comparison of a memory address indicated by an access signal to that memory cell with the defective memory address. The semiconductor storage device also includes a gate array that processes data corresponding to the memory cell selected by the selection circuit upon receiving a power-supply potential and a ground potential. The fuse blocks are arranged in a line or row in the vicinity of the gate array or along the gate array. The power-supply wiring and the ground wiring extend along the direction in which the fuse pieces are juxtaposed. The semiconductor storage device also includes an additional pattern connected to the same potential as that of either the power-supply wiring or the ground wiring, which is farther away from the gate array. The additional pattern extends so as to avoid the fuse exposure window. The semiconductor storage device also includes a supply wire through which the potential of the additional pattern is supplied to the gate array.

According to another aspect of the present invention, there is provided a semiconductor storage device that includes a memory cell array having a plurality of memory cells. The semiconductor storage device also includes a plurality of fuse blocks. Each fuse block is connected to power-supply wiring and to ground wiring. Each fuse block includes a plurality of fuse pieces arranged in a juxtaposed manner. The fuse pieces are exposed to the outside through a fuse exposure window. Each fuse block is adapted to store a defective memory address determined by the mode of cutting the fuse piece(s). The semiconductor storage device also includes a plurality of selection circuits. The selection circuits select one of the memory cells based on a comparison of a memory address indicated by an access signal to that memory cell with the defective memory address. The semiconductor storage device also includes a gate array that processes data corresponding to the memory cell selected by the selection circuits upon receiving a power-supply potential and a ground potential. The selection circuits are arranged in a line or row in the vicinity of the gate array or along the gate array. The fuse blocks are arranged in a line between the selection circuits and the gate array. The power-supply wiring and the ground wiring extend along the direction in which the fuse pieces are juxtaposed, between the selection circuits and the gate array. The gate array receives the power-source potential from the power-supply wiring and receives the ground potential from the ground wiring.

In the semiconductor storage device of the present invention, a great number of logic circuits and fuse blocks can be disposed with space-saving design.

These and other objects, aspects and advantages of the present invention will become apparent to those skilled in the art from the following detailed description when read and understood in conjunction with the appended claims and drawings.

DETAILED DESCRIPTION OF THE INVENTION

An exemplary embodiment of the present invention will now be described in detail with reference to the accompanying drawings.

Figure 3:
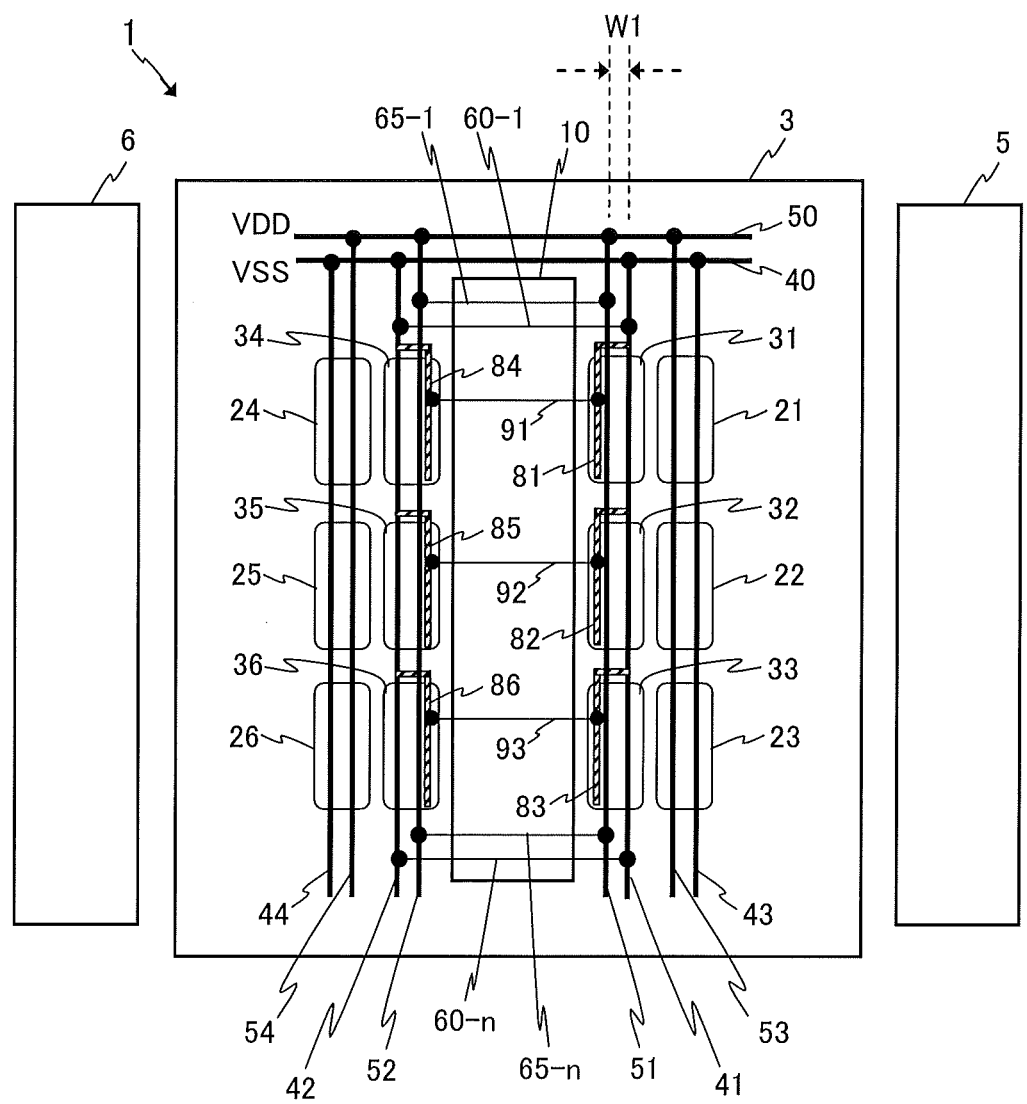
FIG. 3 illustrates a top view of a semiconductor storage device according to one embodiment of the present invention.

Referring to FIG. 3, a semiconductor storage device 1 according to one embodiment of the present invention will be described. The semiconductor storage device 1 is for example a semiconductor memory such as a DRAM or an SRAM.

A memory cell array 5 and another memory cell array 6 each having a plurality of memory cells (not depicted) are disposed on both sides of a chip 3. A gate array 10 is provided between the memory cell array 5 and the memory cell array 6. The gate array 10 is configured to perform write control to the memory cells of the memory cell arrays 5 and 6 and processings such as error correction using an error correcting code (ECC) when reading data from the memory cells. The gate array 10 includes a data processing circuit that operates upon receiving a power-supply potential VDD and a grounding potential VSS. The data processing circuit carries out processing such as the write control and the error correction.

Logic circuits 21 to 23 are arranged or aligned in a row between the gate array 10 and the memory cell array 5. Fuse blocks 31 to 33 are arranged in a row between the gate array 10 and the logic circuits 21 to 23.

Logic circuits 24 to 26 are arranged in a row between the gate array 10 and the memory cell array 6. Fuse blocks 34 to 36 are arranged in a row between the gate array 10 and the logic circuits 24 to 26. In an actual arrangement, more logic circuits (not shown) and more fuse blocks (not shown) may be additionally arranged in the same manner.

Each of the fuse blocks 31 to 36 for example includes a plurality of fuse pieces (see FIG. 4) for storing memory addresses (hereinafter referred to as defective memory addresses) of defective memory cells (not depicted) among the memory cells in the memory cell arrays 5 and 6. The blocks are capable of storing defective memory addresses depending on the mode of cutting the fuse pieces by laser beam irradiations. Each of the fuse blocks 31 to 36 may be used to store trimming data of internal current and internal voltage of the memory cell arrays 5 and 6.

Each of the logic circuits 21 to 26 is a circuit (hereinafter referred to as a selection circuit) that, if a memory address indicated by a memory access signal matches one of defective memory addresses set by the fuse blocks 31 to 36, selects one of backup memory cells (not depicted) included in the memory cell arrays 5 and 6, in place of a defective memory cell (not depicted) associated with the defective memory address. If a memory address indicated by a memory access signal does not match any one of defective memory addresses set by the fuse blocks 31 to 36, then each of the logic circuits 21 to 26 selects one memory cell corresponding to the memory address indicated by the memory access signal. Each of the logic circuits 21 to 26 may be used to control the internal current and/or the internal voltage of the memory cell arrays 5 and 6 in accordance with trimming data set by each of the fuse blocks 31 to 36.

On top of the fuse blocks 31 to 36 are arranged power-supply wires for supplying a VDD potential and a VSS potential to the gate array 10 and each of the fuse blocks 31 to 36, i.e., power-supply wires 41 and 42 for VSS supply and power-supply wires 51 and 52 for VDD supply. Each of the power-supply wires 41, 42, 51, and 52 is a power-supply wire shared by the gate array 10 and the fuse blocks 31 to 36. Specifically, the power-supply wires 41 and 51 are shared by the gate array 10 and the fuse blocks 31 to 33, while the power-supply wires 42 and 52 are shared by the gate array 10 and the fuse blocks 34 to 36.

The power-supply wire 41 and the power-supply wire 51 are juxtaposed spaced apart by an interval W1 from each other. Fuse pieces (see FIG. 5) of the fuse blocks 31 to 33 are interposed between the power-supply wire 41 and the power-supply wire 51 with the interval W1 secured not to hinder the selective cutting of the fuse pieces by the laser beam irradiations through a fuse window 77 (see FIG. 5). Similarly, the power-supply wire 42 and the power-supply wire 52 are juxtaposed spaced apart by the interval W1 from each other.

On top of the logic circuits 21 to 26 are arranged power-supply wires for supplying the VDD potential and the VSS potential to each of the logic circuits 21 to 26, i.e., power-supply wires 43 and 44 for the VSS supply and power-supply wires 53 and 54 for the VDD supply. Each of the power-supply wires 41 to 44 is connected to a VSS wire 40. Each of the power-supply wires 51 to 54 is connected to a VDD wire 50.

The logic circuits 21 to 26 and the fuse blocks 31 to 36 are located in a layer different from a layer in which the power-supply wires 41, 42, 51, and 52 are located. The logic circuits 21 to 26 and the fuse blocks 31 to 36 are provided in, for example, a first metal layer or a second metal layer (see FIG. 5), whereas the power-supply wires 41, 42, 51, and 52 are provided in, for example, a third metal layer (see FIG. 5). The first metal layer, the second metal layer, and the third metal layer are made from a metal such as copper or tungsten.

Supply wires 60-1 to 60-$n$ ($n$ is an integer greater than or equal to 2) are arranged to supply a VSS potential to a data processing circuit (not depicted) in the gate array 10, and supply wires 65-1 to 65-$n$ are arranged to supply a VDD potential to the data processing circuit. One end of each of the supply wires 60-1 to 60-$n$ is connected to the power-supply wire 41, and the other end thereof is connected to the power-supply wire 42. One end of each of the supply wires 65-1 to 65-$n$ is connected to the power-supply wire 51, and the other end thereof is connected to the power-supply wire 52.

The supply wires 60-1 to 60-$n$ for the VSS potential supply are not arranged over (crossing) the fuse blocks 31 to 36. The reason is because if the supply wires 60-1 to 60-*n* were arranged over the fuse blocks 31 to 36, then the presence of the supply wires would become a hindrance (obstacle) to the cutting of the fuse pieces (see FIG. 5) of the fuse blocks 31 to 36 by the laser beam irradiations.

An additional pattern 81 is, for example, an inverted L-shaped or turned L-shaped pattern having one end connected to the power-supply wire 41 and extending to side of the gate array 10 while bypassing the fuse exposure window 77 (FIG. 5) of the fuse block 31. If the additional pattern 81 is provided in the second metal layer (FIG. 5), the one end of the additional pattern 81 is connected through vias 81*a* (FIG. 5) to the power-supply wire 41 formed in a third metal layer (FIG. 5).

Figure 5:
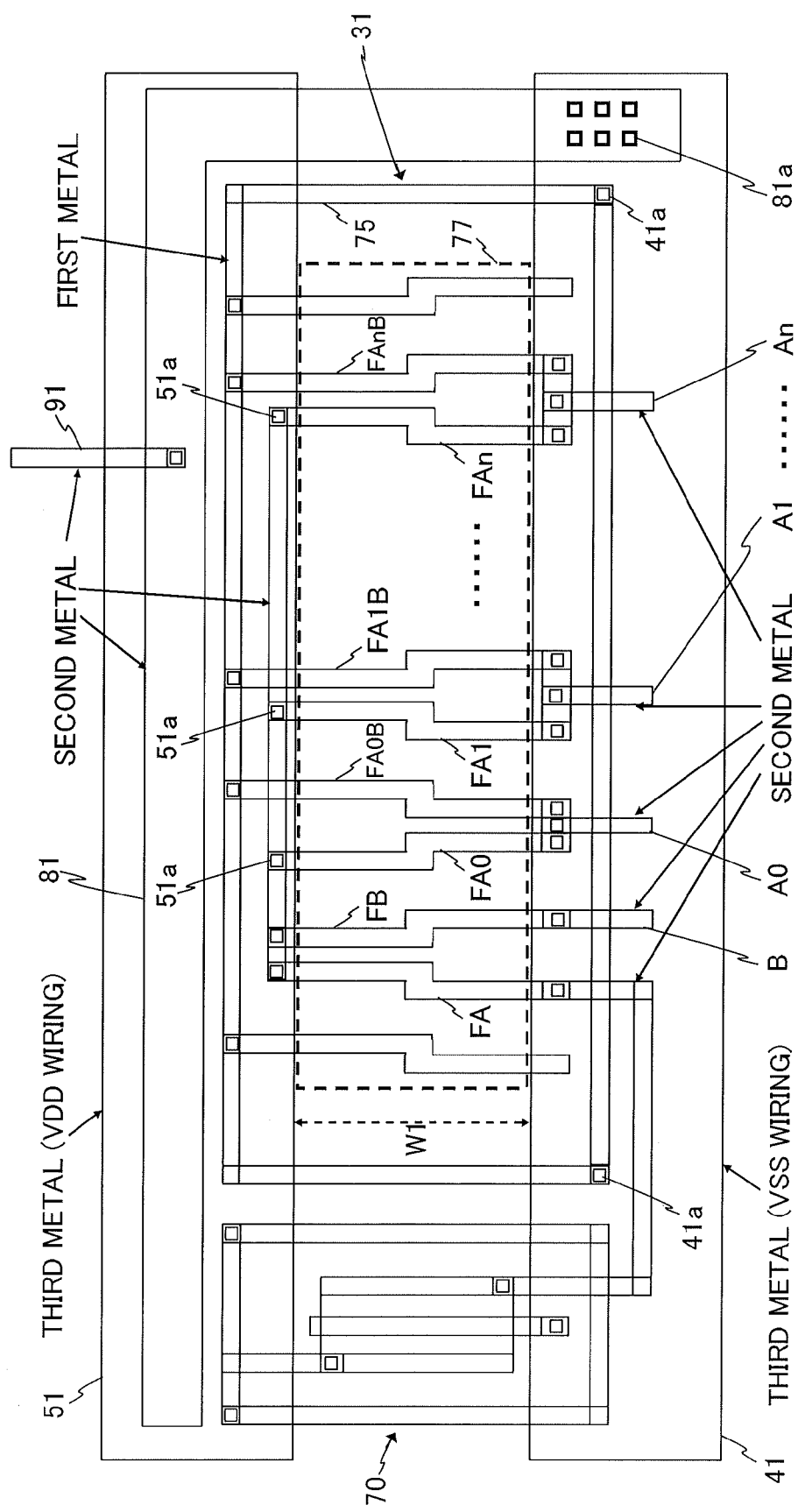
FIG. 5 is an enlarged layout diagram of one fuse block and its peripheral circuit pattern.

Although in FIG. 3, for the sake or clarity and easiness of viewing, the formation position of the additional pattern 81 and the formation position of the power-supply wire 51 are drawn offset from each other, in fact, as depicted in FIG. 5 which will be described later, the additional pattern 81 formed in the second metal layer and the power-supply wire 51 formed in the third metal layer overlap each other. Likewise, each of the additional patterns 82 to 86 also overlaps the power-supply wire 51.

A supply wire 91 is a wire for supplying a VSS potential to those transistors (not shown) of the gate array 10 which are located between the fuse block 31 and the fuse block 34. One end of the supply wire 91 is connected to that portion of the additional pattern 81 which extends between the gate array 10 and the fuse exposure window 77 (see FIG. 5) of the fuse block 31, and the other end thereof is connected to a portion of the additional pattern 84 which extends toward the gate array 10.

The above-described configuration enables the supply wire 91 to supply the VSS potential to the transistors (not depicted) located between the fuse block 31 and the fuse block 34 without crossing the fuse exposure window 77 (see FIG. 5) of the fuse block 31 and a fuse exposure window (not depicted) of the fuse block 34. Each of the supply wires 92 and 93 is formed in the same manner as the supply wire 91.

In FIG. 3 the supply wire 91 is only depicted between the fuse block 31 and the fuse block 34, the supply wire 92 is only depicted between the fuse block 32 and the fuse block 35, and the supply wire 93 is only depicted between the fuse block 33 and the fuse block 36. In reality, however, a plurality of supply wires (not depicted) are also arranged between the fuse blocks 31 and 34, between the fuse blocks 32 and 35, and between the fuse blocks 33 and 36.

Figure 4:
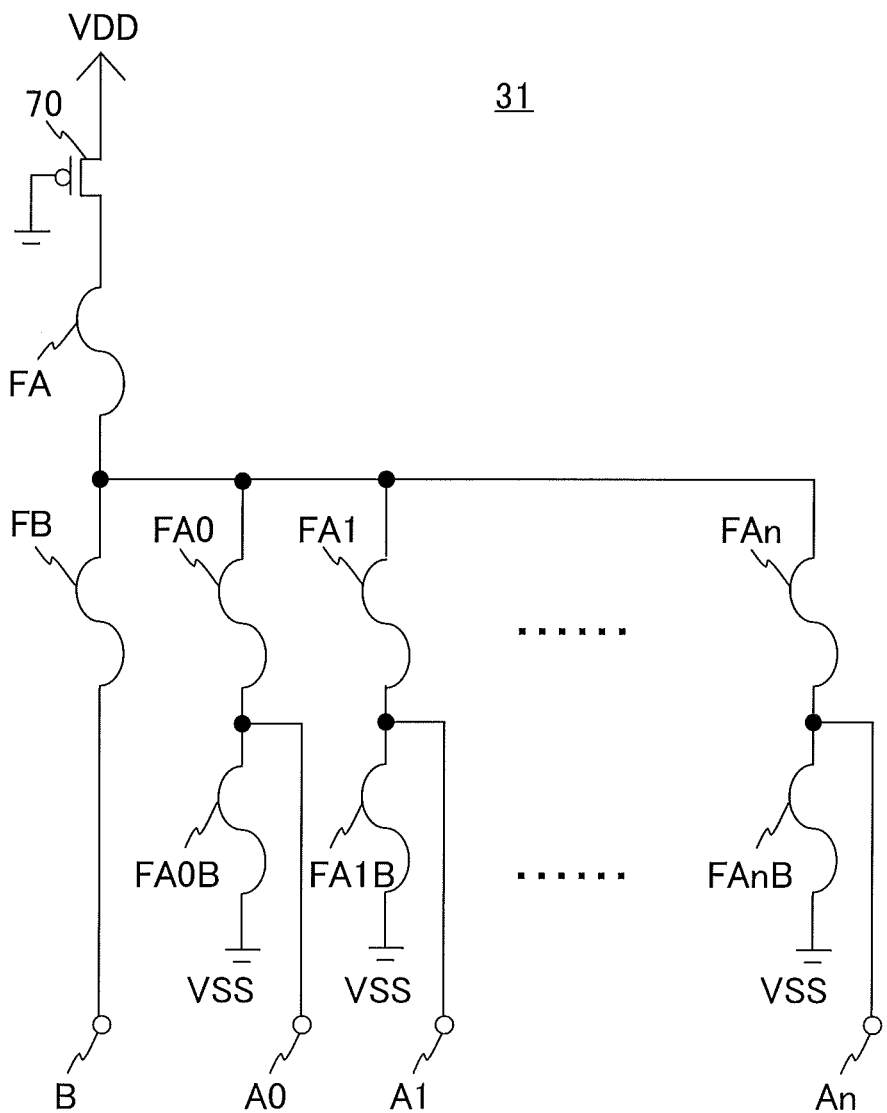
FIG. 4 is a circuit diagram depicting a circuit configuration of a fuse block disposed on the semiconductor storage device shown in FIG. 3.

FIG. 4 is a circuit diagram depicting a circuit configuration of the fuse block 31. A fuse piece FA0 and a fuse piece FA0B are connected in series to each other. A terminal A0 extends from a connection point (node) between the fuse piece FA0 and the fuse piece FA0B. Pairs of a fuse piece FA1 and a fuse piece FA1B, . . . , a fuse piece FAn and a fuse piece FAnB are also connected in series, respectively, in the same manner. Terminals A1, . . . , An extend from connection points of the respective fuse piece pairs.

The pairs of the fuse piece FA0 and the fuse piece FA0B, . . . , the fuse piece FAn and the fuse piece FAnB are connected in parallel to one another. A VDD potential is supplied via a transistor 70 and a fuse piece FA to each of the fuse pieces FA0, . . . , FAn. The supply of the VDD potential to each of the fuse pieces FA0, . . . , FAn is carried out through the power-supply wire 51 depicted in FIG. 3. The transistor 70 is a p-channel MOS transistor. One end of each of the fuse pieces FA0B to FAnB is connected to a VSS potential. The VSS potential is supplied to each of the fuse pieces FA0B to FAnB through the power-supply wire 41 depicted in FIG. 3.

The fuse piece FA and a fuse piece FB are connected in series to each other, with a terminal B extending from the fuse piece FB. An output potential of each of the terminals B and A0 to An is supplied to, for example, the logic circuit 21 (see FIG. 1).

If the output potential of the terminal A0 is set to a low level, i.e., a VSS potential, the fuse piece FA0 is cut off. If the output potential of the terminal A0 is set to a high level, i.e., a VDD potential, the fuse piece FA0B is cut off. The selective fuse cutting is similarly applied to the pair of the fuse piece FA1 and the fuse piece FA1B, . . . , the fuse piece FAn and the fuse piece FAnB, thereby enabling the output potential to be set to low or high.

By setting the high-level or low-level potential for each of the fuse piece pairs, it is possible to set defective memory addresses of defective memory cells (not depicted) among the memory cells in the memory cell arrays 5 and 6 and to set (determine) trimming data of the internal current and the internal voltage of the memory cell arrays 5 and 6. Each of the fuse blocks 32 to 36 also has a similar configuration to that of the fuse block 31.

FIG. 5 is an enlarged layout diagram of the fuse block 31, the power-supply wirings 41 and 51, and a power pattern 80. The semiconductor storage device 1 may have three layers, namely a first metal layer, a second metal layer and a third metal layer.

Figure 1:
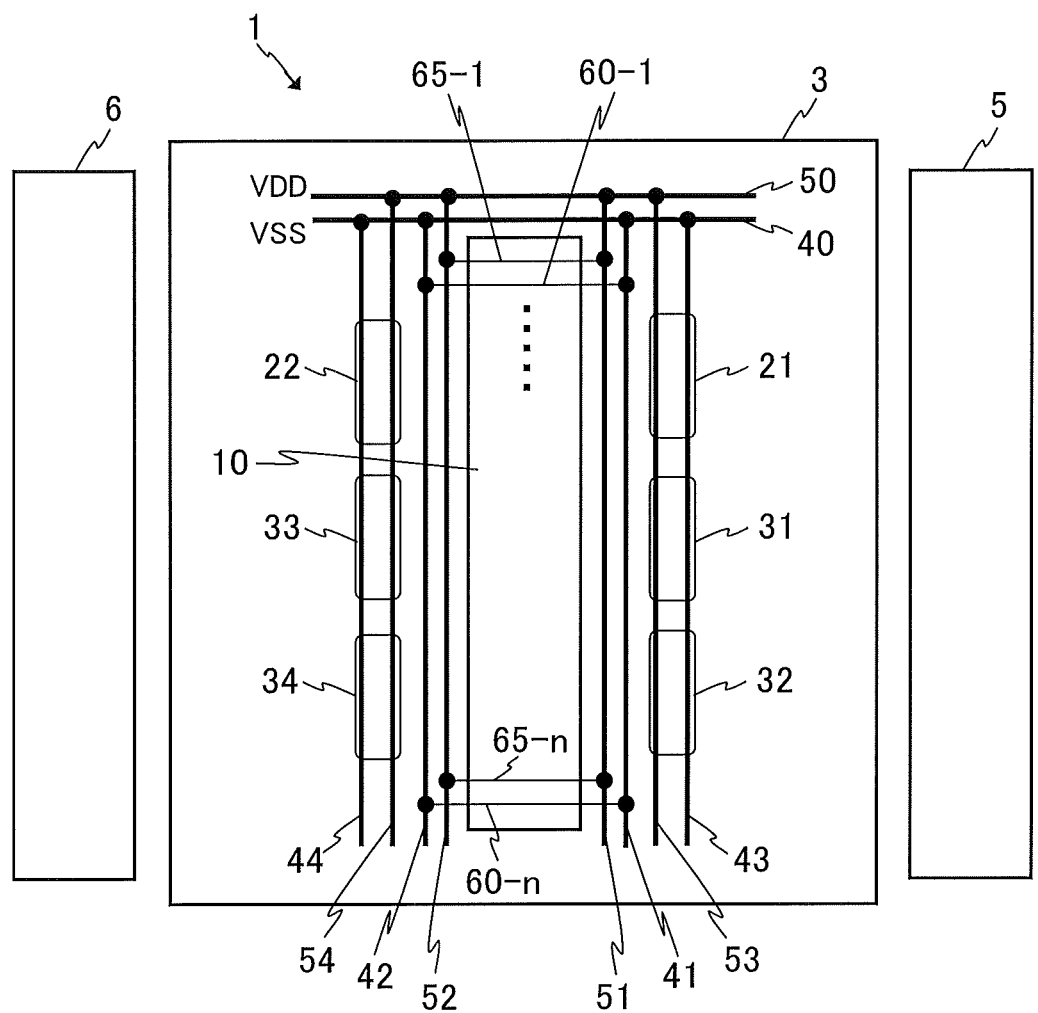
FIG. 1 is a top view of a conventional semiconductor storage device.
Figure 2:
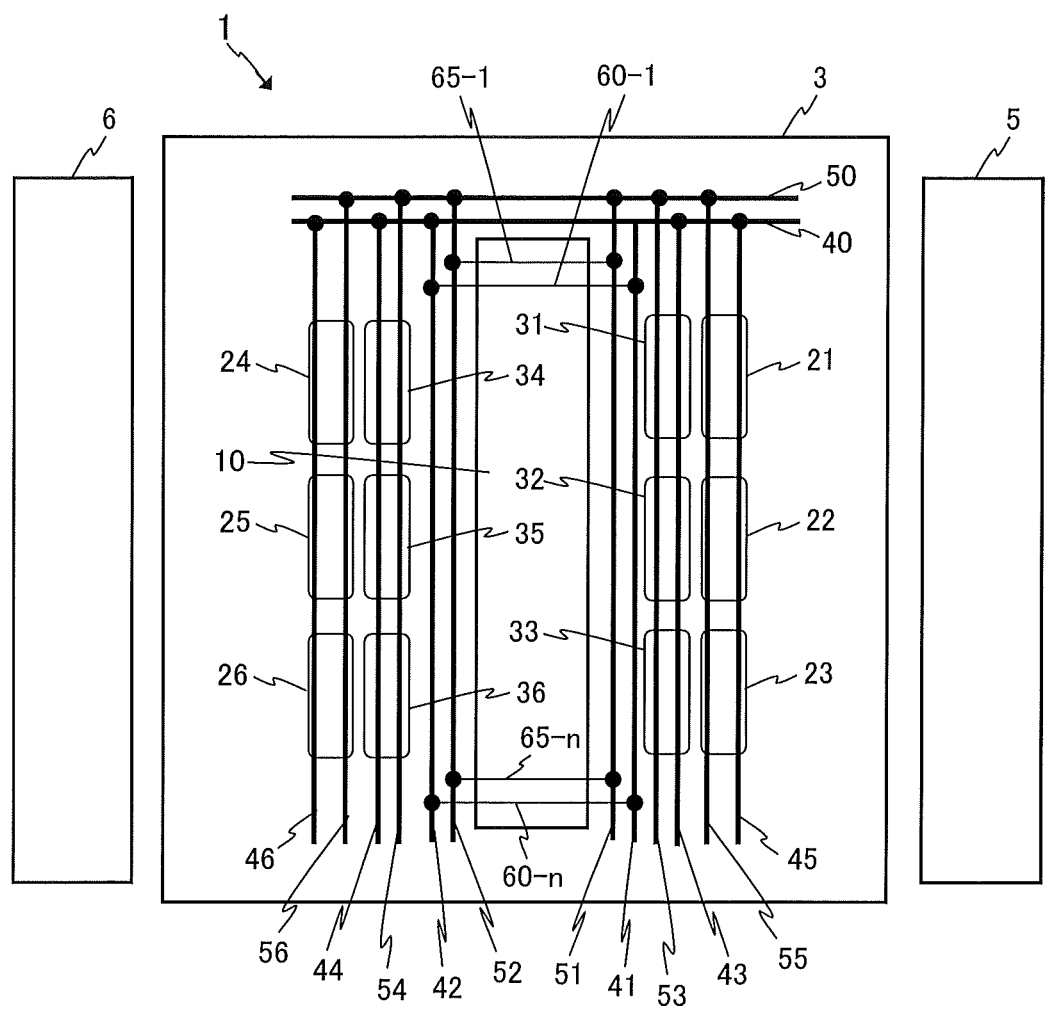
FIG. 2 is a top view of another conventional semiconductor storage device.

In this layout the power-supply wiring 41 and the power-supply wiring 51 are juxtaposed along the gate array 10 depicted in FIG. 1. The power-supply wirings 41 and 51 are provided in the third metal layer. The power-supply wiring 41 is power-supply wiring for supplying a VSS potential to the fuse block 31 of FIG. 5 and to the gate array 10 and the fuse blocks 32 and 33 of FIG. 3. The power-supply wiring 51 is power-supply wiring for supplying a VDD potential to the fuse block 31 of FIG. 5 and to the gate array 10 and the fuse blocks 32 and 33 of FIG. 3. As seen in FIG. 3, the power-supply wiring 41 is placed farther away from the gate array 10 than the power-supply wiring 51.

The fuse block 31 lies between the power-supply wiring 41 and the power-supply wiring 51. The fuse block 31 is provided in the first metal layer and the second metal layer. The fuse pieces FA, FB, FA0 to FAn, and FA0B to FAnB in the fuse block 31 are exposed through the fuse exposure window 77 to the exterior in a juxtaposed manner. To allow the selective cutting of the fuse pieces FA, FB, FA0 to FAn, and FA0B to FAnB with the laser beam irradiations, the power-supply wiring 41 and the power-supply wiring 51 extend along the direction in which the fuse pieces are juxtaposed. The wiring 41 is spaced from the wiring 51 by the interval W1.

One end of each of the fuse pieces FA0 to FAn provided in the first metal layer and/or the second metal layer and/or a polysilicon layer is connected to the power-supply wire 51 provided in the third metal layer, through an associated via 51*a* (FIG. 5). One end of each of the fuse pieces FA0B to FAnB provided in the first metal layer and/or the second metal layer is connected to VSS connection wiring 75 provided in the first metal layer. The VSS connection wiring 75 extends to surround the fuse pieces FA, FB, FA0 to FAn, and FA0B to FAnB and is connected to the power-supply wiring 41 provided in the third metal layer by vias 41*a* (FIG. 5). The fuse pieces FA0 and FA0B are connected to each other in the first metal layer or the second metal layer. The same applies to the fuse pieces FA1 and FA1B, . . . , FAn and FAnB. In the second metal layer, the terminals A0, . . . , An extend from the corresponding connection points between the fuse pieces FA0 and FA0B, . . . , FAn and FAnB.

A pattern including a source terminal of the transistor 70 provided in the first metal layer and the second metal layer is connected through vias to the power-supply wiring 51 provided in the third metal layer. A pattern including a drain terminal of the transistor 70 is connected to the fuse piece FA. In the second metal layer, the terminal B extends from the fuse piece FB connected to the fuse piece FA.

The additional pattern 81 is provided in the second metal layer. One end of the additional pattern 81 is connected through vias 81*a* to the power-supply wiring 41 provided in the third metal layer. Thus, the additional pattern 81 is connected to the same potential as that of the power-supply wiring 41, i.e., to the VSS potential. The additional pattern 81 has an inverted or turned L-shape so as to avoid the fuse block 31. The additional pattern 81 extends from the connection with the power-supply wiring 41, while avoiding the fuse exposure window 77, toward the side where the gate array 10 (see FIG. 3) lies, i.e., toward the side where the power-supply wiring 51 lies. As seen in FIG. 5, the additional pattern 81 preferably extends along the longitudinal direction of the gate array 10 (see FIG. 3). At least a part (e.g., an upper end portion) of the additional pattern 81 preferably overlaps the power-supply wiring 51 of the third metal layer with certain spacing in the direction orthogonal to the surface of the additional pattern 81. This advantageously contributes to a reduction in area of the chip 1.

One end of the supply wiring 91 is connected to that portion of the additional pattern 81 which is situated between the gate array 10 (see FIG. 3) and the fuse block 31. The other end of the supply wiring 91 is connected to the additional pattern 84 (see FIG. 3) that is provided on the power-supply wiring 42 (see FIG. 3). This configuration enables the supply wiring 91 to supply a potential of the additional pattern 81, i.e., a VSS potential, to the gate array 10 between the fuse block 31 and the fuse block 34 (see FIG. 3) without crossing the fuse block 31.

From the viewpoint of suppressing or limiting a rise in potential upon receiving the VSS potential through the additional pattern 81 to thereby prevent a malfunction of the gate array 10, it is preferred that the additional pattern 81 has a greater width. It is preferred that the width of the additional pattern 81 be greater than that of the VSS connection wire 75 for example. This is because the resistance value of the additional pattern 81 can be suppressed to a relatively low value.

Although the supply wire 91 is only illustrated in FIG. 5, a plurality of supply wires (not shown) are also disposed in the actual arrangement. The layout of the fuse block 31 is used, in effect, as the layout of each of the fuse blocks 32 to 36.

In the semiconductor storage device 1 of this embodiment, the additional pattern 81 extends from the power-supply wire 41, which is positioned farther than the fuse block 31 when viewed from the gate array 10, to the position between the gate array 10 and the fuse block 31 while avoiding the fuse block 31 so that a VSS potential is supplied from the supply wire 91 connected to the additional pattern 81 to the transistors (not depicted) of the gate array 10.

The above-described configuration achieves a space-saving and allows a disposition (provision) of a greater number of logic circuits 21 to 26 and fuse blocks 31 to 36 in a limited footprint, as compared with the prior art. This prevents an increase in the cost arising from the increased size of the semiconductor storage device 1 even in the case where the number of the logic circuits and of the fuse blocks increases with an increase in the memory capacity. No disturbance is present when the laser beam irradiations cut the fuse pieces of the fuse blocks 31 to 33 disposed between the power-supply wire 41 and the power-supply wire 51 and the fuse pieces of the fuse blocks 34 to 36 disposed between the power-supply wire 42 and the power-supply wire 52.

If the supply wire 91 is directly connected to the VSS connection wire 75 of the first metal layer instead of being connected to the additional pattern 81, the VSS potential may increase upon the operation of the gate array 10 due to a high resistance value of the VSS connection wire 75 that is a relatively thin (or narrow) wire. This creates problems such as an operation speed reduction and/or a malfunction. Also, if the supply wire 91 is directly connected to the VSS connection wire 75 formed in the first metal layer, with the second metal layer and the third metal layer being made of copper or aluminum for example and with the first metal layer being made of tungsten for example that is higher in resistivity than copper, then similar problems may occur since the VSS connection wire 75 has a high resistance value. On the contrary, the semiconductor storage device 1 of this embodiment does by no means bring about such problems since the supply wire 91 is coupled to the additional pattern 81 having a relatively large wire width and a relatively small resistance value and therefore the VSS potential is not allowed to increase.

Although one end of the additional pattern 81 in this embodiment is connected to the power-supply wire 41, it may be connected to the VSS wire 40. The same may apply to the additional patterns 82 to 86.

Although the six additional patterns 81 to 86 are associated with the six fuse blocks 31 to 36 in the illustrated embodiment (FIG. 3), respectively, each additional pattern may not necessarily be provided for one fuse block. For example, one additional pattern may be shared by a plurality of fuse blocks. In one embodiment, a single pattern may only be provided and shared by all the fuse blocks. It should be noted that any suitable additional pattern may be employed as long as the additional pattern connects to one power-supply wiring in a pair of power-supply wires for supplying power to the fuse block(s) and extends in the vicinity of the other power-supply wiring in that pair of power-supply wires.

It should be noted that the additional pattern 81 may be dispensed with, if the formation layer of the supply wiring 91 is suitably modified. The present invention utilizes the space (i.e., open space or non-used area) in the vicinity of the gate array 10 for the arrangement of the fuse blocks.

This application is based on Japanese Patent Application No. 2010-286152 filed on Dec. 22, 2010, and the entire disclosure thereof is incorporated herein by reference.

What is claimed is:
1. A semiconductor storage device comprising:
a memory cell array including a plurality of memory cells;
a plurality of fuse blocks, each fuse block being connected to a power-supply wire and to a ground wire, each fuse block including a plurality of fuse pieces arranged in a juxtaposed manner and exposed to an outside through a fuse window, each fuse block storing a defective memory address determined by a mode of cutting the fuse pieces, with the power-supply wire and the ground wire extending along a direction in which the fuse pieces are juxtaposed;
a selection circuit that selects one of the memory cells based on a comparison of a memory address indicated by an access signal to said one of the memory cells with the defective memory address;
a gate array that processes data corresponding to the memory cell selected by the selection circuit upon receiving a power-supply potential and a ground potential, with the plurality of fuse blocks being arranged in a line in the vicinity of the gate array;

an additional pattern connected to a same potential as that of one of the power-supply wire and the ground wire which is farther away from the gate array, the additional pattern extending so as to avoid the fuse window; and a supply wire through which a potential of the additional pattern is supplied to the gate array.

2. The semiconductor storage device of claim 1, wherein the additional pattern extends in the vicinity of the other of the power-supply wire and the ground wire which is closer to the gate array.

3. The semiconductor storage device of claim 1 further comprising a plurality of metal layers, wherein the additional pattern is formed in one of the metal layers different from those metal layers in which the power-supply wire and the ground wire are provided.

4. The semiconductor storage device of claim 2, wherein the additional pattern has an overlapping positional relationship with said other of the wires which is closer to the gate array.

5. The semiconductor storage device of claim 1, wherein the additional pattern has a plurality of pattern pieces such that each fuse block has at least one pattern piece.

6. The semiconductor storage device of claim 1, wherein the semiconductor storage device is a DRAM or an SRAM.

7. The semiconductor storage device of claim 1, wherein cutting of the fuse pieces is carried out with laser beam radiation.

8. The semiconductor storage device of claim 1, wherein the fuse blocks additionally store trimming data of at least one of an internal current and an internal potential of the memory cell array.

9. The semiconductor storage device of claim 1, wherein the selection circuit selects one of the memory cells when the memory address indicated by the access signal matches the defective memory address.

10. The semiconductor storage device of claim 3, wherein the additional pattern has an L-shape.

11. The semiconductor storage device of claim 1, wherein two or more of said fuse blocks share one of the additional patterns.

12. A semiconductor storage device comprising:
a memory cell array including a plurality of memory cells;
a plurality of fuse blocks, each fuse block being connected to a power-supply wire and to a ground wire, each fuse block including a plurality of fuse pieces arranged in a juxtaposed manner and exposed to an outside through a fuse window, each fuse block storing a defective memory address determined by a mode of cutting the fuse pieces;

a plurality of selection circuits for selecting one of the memory cells based on a comparison of a memory address indicated by an access signal to said one of the memory cells with the defective memory address;

a gate array for receiving a power-source potential from the power-supply wire and a ground potential from the ground wire and for processing data corresponding to the selected memory cell, with the plurality of selection circuits being arranged in a line in the vicinity of the gate array, the plurality of fuse blocks being arranged in a line extending in a first direction between the plurality of selection circuits and the gate array, the power-supply wire and the ground wire extending along a direction in which the fuse pieces are juxtaposed, between the plurality of selection circuits and the gate array; and a supply wire which extends in a second direction that is substantially perpendicular to the first direction from a region where the plurality of fuse blocks are disposed to supply the ground potential to the gate array.

13. The semiconductor storage device of claim 12, wherein the power-supply wire and the ground wire are arranged on the plurality of fuse blocks in such a manner as to avoid the fuse window.

14. The semiconductor storage device of claim 12, wherein the semiconductor storage device is a DRAM or an SRAM.

15. The semiconductor storage device of claim 12, wherein cutting of the fuse pieces is carried out with laser beam radiation.

16. The semiconductor storage device of claim 12, wherein the fuse blocks additionally store at least one of trimming data of an internal current and an internal potential of the memory cell array.

17. The semiconductor storage device of claim 12, wherein the selection circuits selects said one of the memory cells when the memory address indicated by the access signal matches the defective memory address.

\* \* \* \* \*